(12) United States Patent
Ravi et al.

(10) Patent No.: US 6,548,313 B1
(45) Date of Patent: Apr. 15, 2003

(54) AMORPHOUS CARBON INSULATION AND CARBON NANOTUBE WIRES

(75) Inventors: Kramadhati V. Ravi, Atherton, CA (US); Eric C. Hannah, Pebble Beach, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/159,236

(22) Filed: May 31, 2002

(51) Int. Cl.[7] .............................................. H01L 21/00
(52) U.S. Cl. ........................ 438/6; 438/128; 438/479; 438/430
(58) Field of Search ............................ 438/5, 6, 128, 438/105, 931, 421, 430, 479, 483; 257/77, 103; 427/248.1, 376.1

(56) References Cited

U.S. PATENT DOCUMENTS 6,146,227 A * 11/2000 Mancevski .................. 445/24
6,440,761 B1 * 8/2002 Choi ............................ 438/20
6,448,701 B1 * 9/2002 Hsu ............................ 313/309
2001/0023986 A1 * 9/2001 Mancevski .................. 257/741
2002/0092984 A1 * 7/2002 Colbert et al. ............... 250/306
2002/0117659 A1 * 8/2002 Lieber et al. ................. 257/14
2002/0122766 A1 * 9/2002 Lieber et al. ............. 423/447.3
2002/0130353 A1 * 9/2002 Liber et al. .................. 257/315
2002/0158342 A1 * 10/2002 Tuominen et al. .......... 257/784
2002/0160111 A1 * 10/2002 Sun et al. ................. 427/376.1
2002/0167375 A1 * 11/2002 Hoppe et al. ............... 333/186

* cited by examiner

*Primary Examiner*—Savitri Mulpuri
(74) *Attorney, Agent, or Firm*—Blakely, Sokoloff, Taylor & Zafman LLP (57) ABSTRACT

An apparatus includes a carbon nanotube coupled with a first device and a second device of an integrated circuit, wherein electrons can flow between the first device and the second device along the carbon nanotube. Doped amorphous carbon is deposited on the integrated circuit structure. The doped amorphous carbon is planarizing and patterned to form a trench. Carbon based precursor material is deposited in the trench. The carbon based precursor material is converted into the carbon nanotube, wherein the carbon nanotube connects the first device with the second device.

13 Claims, 11 Drawing Sheets

FIG. 10

AMORPHOUS CARBON INSULATION AND CARBON NANOTUBE WIRES

BACKGROUND

1. Field

Embodiments of the invention relate generally to the field of chip level interconnections for integrated circuits, and more specifically to making chip level interconnections using carbon based dielectric and carbon nanotube wires.

2. Background

An integrated circuit requires interconnections between the various devices that are constructed in the silicon wafer. The interconnections can limit the maximum data rate that is possible to achieve within the integrated circuit. Copper is presently used for integrated circuit interconnection wires or traces. Dielectrics like silicon dioxide or doped silicon dioxide are used to insulate the copper traces. Together the resistance (R) of the copper trace, used for the interconnection, and the capacitance (C) that exists across silicon dioxide contained between copper traces, forms a time constant (RC), which introduces a time delay that limits the maximum rate at which data can be transferred to and from the devices within the integrated circuit. The capacitance that exists across the insulation material is related to the dielectric constant of the silicon dioxide. Consequently, a lower dielectric constant results in a lower capacitance across the dielectric and a higher data transfer rate to and from the devices within the integrated circuit.

Copper is diffusive, possessing inherent electrical resistance that limits the minimum achievable time constant previously described. Similarly, present insulation materials like doped silicon dioxide have dielectric constants that cannot be reduced much further than present values. Fluorine is used to dope silicon dioxide, thereby reducing its dielectric constant from approximately 4 to 3.0–4.0. There is no other metal that can exceed the electrical conductivity of copper, at device operating temperatures, and fluorine doped silicon dioxide is limited in terms of how much further its dielectric constant can be reduced. Therefore, the current data transfer rates of an integrated circuit can be limited by the electrical properties of the interconnections made between devices within the integrated circuit.

Device size within an integrated circuit presents another limitation to data transfer speeds. The data transfer speed, density, and efficiency of microelectronic devices all rise rapidly as the minimum device size decreases. Present interconnections using copper traces and doped silicon dioxide present limitations to shrinking the device size much below present geometries.

BRIEF DESCRIPTION OF THE DRAWINGS

The invention may best be understood by referring to the following description and accompanying drawings that are used to illustrate embodiments of the invention. The invention is illustrated by way of example and is not limited in the figures of the accompanying drawings, in which like references indicate similar elements. In the drawings.

DETAILED DESCRIPTION

In the following detailed description, numerous specific details are set forth. However, it is understood that embodiments of the invention may be practiced without these specific details. In other instances, well-known circuits, structures, and techniques have not been shown in detail in order not to obscure the understanding of this description. These embodiments are described in sufficient detail to enable those of ordinary skill in the art to practice the invention. The following detailed description is, therefore, not to be taken in a limiting sense, and the scope of the invention is defined only by the appended claims.

Figure 1:
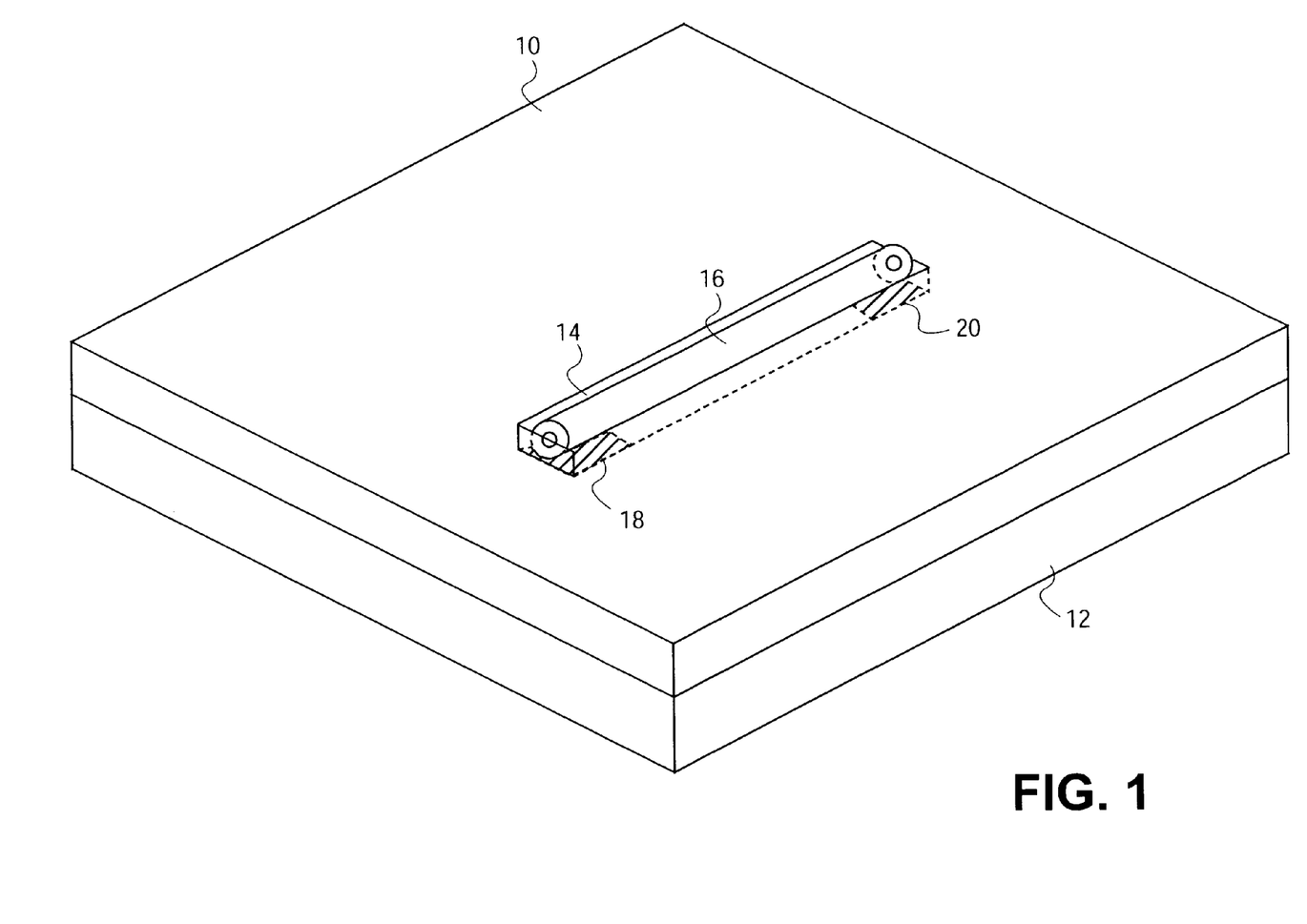
FIG. 1 illustrates carbon insulation and a carbon nanotube used for interconnections on an integrated circuit structure.

Carbon nanotubes are used for interconnections on an integrated circuit, replacing existing copper interconnections. Carbon nanotubes conduct electrons ballistically—without the scattering that gives copper its resistance. Amorphous, carbon based (low dielectric constant) insulation is used to insulate the carbon nanotubes and has a dielectric constant lower than that of fluorine doped silicon dioxide. FIG. 1 illustrates carbon insulation and a carbon nanotube used for interconnections on an integrated circuit.

With reference to FIG. 1, a doped amorphous carbon based (low dielectric constant) material 10 is deposited onto an integrated circuit structure 12. In one embodiment, the deposition of the doped amorphous carbon based material 10 can be performed by techniques, well known to those of ordinary skill in the art, such as chemical vapor deposition (CVD) and plasma enhanced chemical vapor deposition (PCVD).

The doped amorphous carbon material is planarized using chemical mechanical polishing (CMP), as is well known by those of ordinary skill in the art. The planarized doped amorphous carbon material is patterned using photolithography and etching. The resulting doped amorphous carbon film is etched to create a patterned layer. In one embodiment, trench 14 results from the etching. Carbon based precursor material is deposited into the pattern in the doped amorphous carbon (low dielectric constant) layer. A carbon nanotube 16 is created from the carbon based precursor material and is used as an electrical interconnection between a first device contact 18 and a second device contact 20 of the integrated circuit 10. The processes can be repeated to create multiple layers of chip level interconnections using carbon nanotubes and the doped amorphous carbon based (low dielectric constant) insulation.

Figure 2:
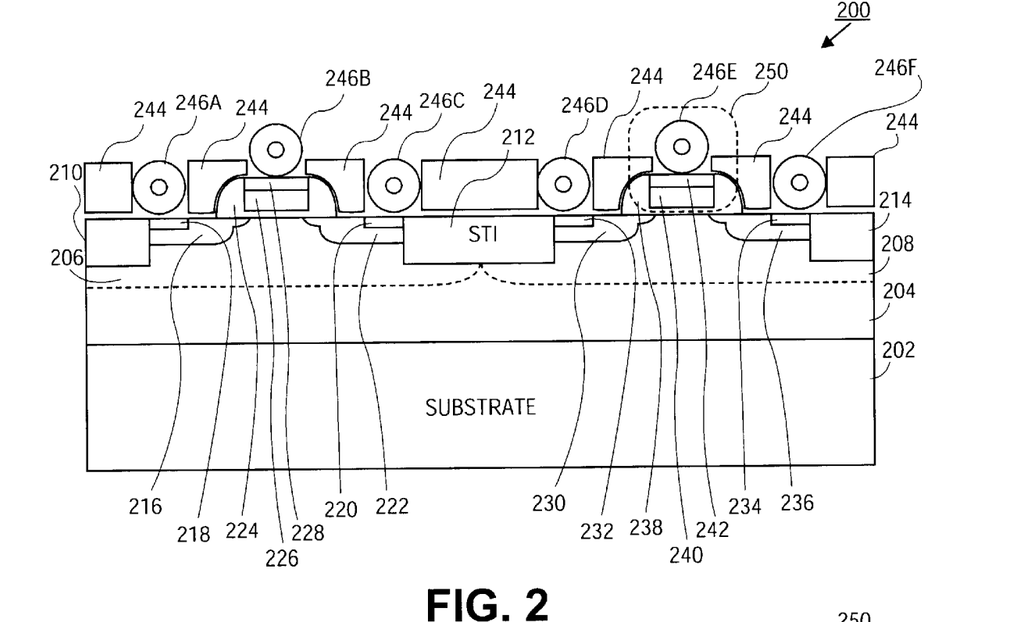
FIG. 2 shows a cross sectional view of an integrated circuit structure using carbon insulation and carbon nanotube wires.

As previously mentioned, carbon based insulation and the highly conductive nanotubes combine to provide greater data transfer rates to and from the devices within an integrated circuit when used as the insulation and conductive elements in the integrated circuit interconnections. FIG. 2 shows a cross sectional view of an integrated circuit structure using carbon insulation and carbon nanotube wires for chip level interconnections. With reference to FIG. 2, in one embodiment, the invention can be applied to a complimentary metal oxide semiconductor (CMOS) integrated circuit containing a PMOS transistor and an NMOS transistor. A common substrate 202 underlies an epitaxial layer 204. The NMOS transistor has a P-well 206 formed within the epitaxial layer 204. The NMOS transistor has an N+ source 216, an N+ drain 222, a silicon dioxide region 224, and an N+ polysilicon gate 226. In the description of the NMOS transistor, the source could have been labeled as region 222 and the drain could have been labeled as region 216. No limitation is imposed on the invention, source and drain have been identified for illustration only. The NMOS transistor is separated from the PMOS transistor by shallow trench isolation 212 on the right side and is isolated by shallow trench isolation 210 on the left side. Similarly, the PMOS transistor includes an N-well 208 formed within the epitaxial layer 204. The PMOS transistor has a P+ source 230, a P+ drain 234, a silicon dioxide region 238, and a P+polysilicon gate 240. Similar to the labeling of the NMOS transistor, the source of the PMOS transistor could have been labeled as region 234 and the drain as region 230. No limitation is imposed on the invention, source and drain have been identified for illustration only. The PMOS transistor is separated from the NMOS transistor by the shallow trench isolation 212 on the left side and is isolated by shallow trench isolation 214 on the right side. As is well known by those of ordinary skill in the art, the view presented by FIG. 2 can represent two transistors from a wafer containing many transistors, existing in a two-dimensional plane extending into and out of the plane of the figures. The cross sectional view of the two transistors has been chosen for clarity. The number of devices or the kind of devices interconnected together does not limit the present invention. CMOS transistors were chosen for this illustration, however, other types of devices could have been used in this description without loss of generality. Other types of devices include but are not limited to a resistor, a capacitor, and an inductor.

The integrated circuit structure previously described and defined by elements 202, 204, 206, 208, 210, 212, 214, 216, 222, 224, 226, 230, 234, 238, and 240 will be used in the figures that follow and will not be numbered when used therein. Elements 202, 204, 206, 208, 210, 212, 214, 216, 222, 224, 226, 230, 234, 238, and 240 will not be renumbered so that the figures do not become unduly complicated.

Figure 3:
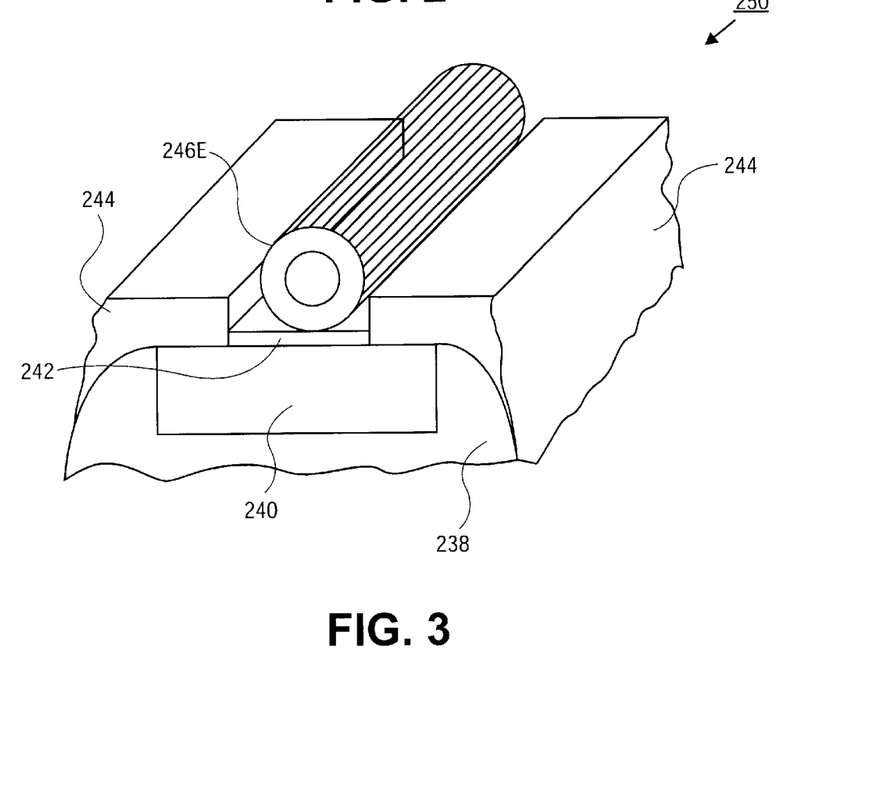
FIG. 3 is a close-up three-dimensional view of a carbon nanotube wire making a connection with a transistor.

Referring back to FIG. 2 copper traces formerly used as interconnects (not shown) are replaced by carbon nanotubes 246a, 246b, 246c, 246d, 246e, and 246f. Ohmic contacts 218, 220, 228, 232, 236, and 242 are positioned under the nanotubes respectively. The ohmic contacts can be made out of tungsten and can serve as a catalyst during the formation of the carbon nanotube described below in conjunction with FIG. 9. Doped amorphous carbon (low dielectric constant) material remains in between the carbon nanotubes as shown by 244. A region of FIG. 2 at 250 is shown in a close-up three-dimensional view in FIG. 3. The ohmic contact 242 need not extend under the entirety of the carbon nanotube 246e. In one embodiment, the ohmic contact need only partially cover the P+ polysilicon gate 240 to facilitate catalyzing the formation of the carbon nanotube.

Figure 4:
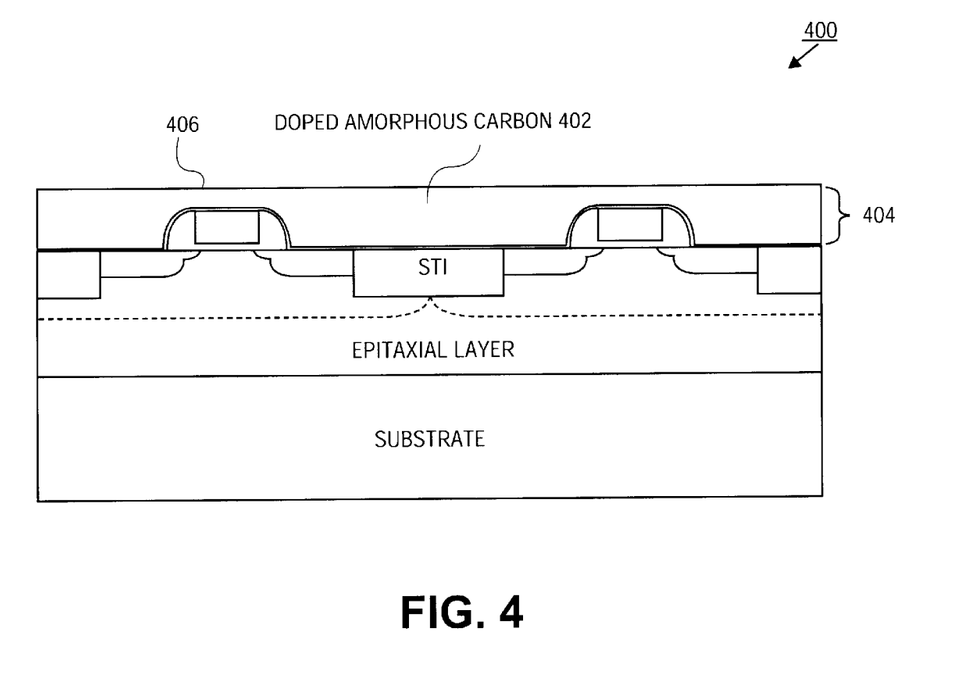
FIG. 4 illustrates a cross sectional view of an integrated circuit structure including a doped amorphous carbon (low dielectric constant) layer.

FIG. 4 illustrates a cross sectional view 400 of an integrated circuit structure including a doped amorphous carbon (low dielectric constant) layer of thickness 404. The layer 404 can be applied according to several methods that are well known by those of ordinary skill in the art. The invention is not limited by the method used to apply the region 404. In one embodiment, amorphous carbon can be doped with silicon or germanium to create the low dielectric constant amorphous carbon layer. Physical vapor deposition (PVD), chemical vapor deposition (CVD), and plasma enhanced chemical vapor deposition (PECVD) techniques can be used to deposit the region 402 on the underlying integrated circuit structure. The thickness 404 of region 402 can be varied as desired for particular applications; 0.1 to 1 micron thicknesses are typical. The dielectric constant of the region 404 can be controlled by doping with silane ($SiH_4$) or germanium hydride ($GeH_4$) in a co-deposition process, as is well known by those of ordinary skill in the art.

In one non-limiting example, the PECVD process can be used at a temperature of 300 to 500 degrees centigrade, a pressure of 5 to 50 millitorr, for a time of 10 to 20 minutes. The process gas can be a hydrocarbon such as methane or ethane. Silane or germane can be used as dopants. Argon can be used for dilution. A plasma can be generated inside a chamber using radio frequency (RF) energy, microwave energy or other suitable means. In one non-limiting example, silane or germane can represent 10 to 20 percent of the process gas by volume while the process gas and the gas used for dilution make up the remaining 80 to 90 percent. Dielectric constants for the doped amorphous carbon in the range of 1.5 to 2.5 can be achieved. The volume percentage of the dopant gas (silane or germane) can be decreased to increase the dielectric constant or the volume percentage of the dopant gas can be increased to decrease the dielectric constant of the doped amorphous carbon. Following the deposition of the doped amorphous carbon (low dielectric constant) layer, the surface 406 of the layer 402 can be planarized using techniques, that are well known by those of ordinary skill in the art, such as chemical mechanical polishing (CMP). Abrasive agent such as aluminum oxide and a chemical agent such as potassium hydroxide can be used during CMP.

Figure 5A:
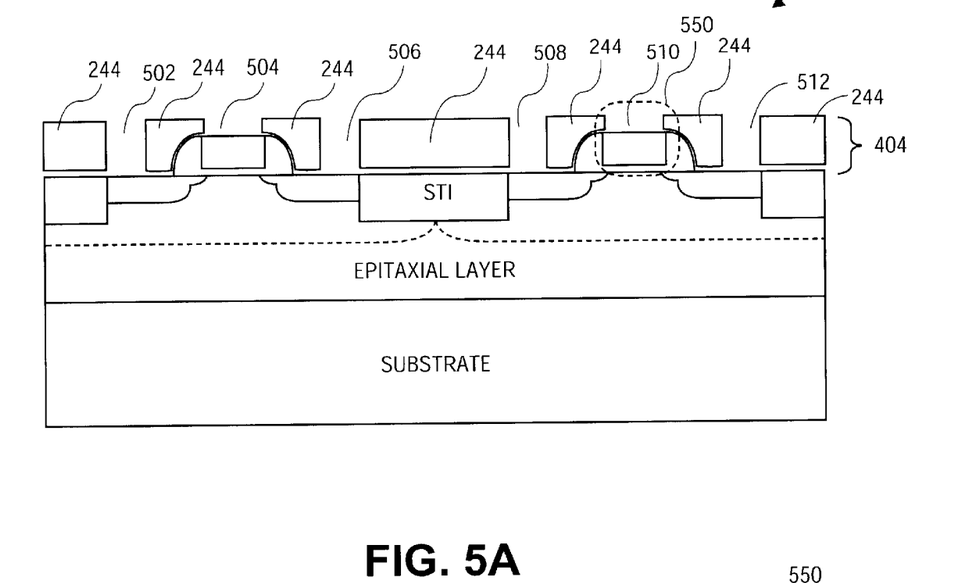
FIG. 5A illustrates a pattern in the doped amorphous carbon (low dielectric constant) layer.

In one embodiment, the doped amorphous carbon (low dielectric constant) layer is patterned using lithography processes and etching that are well known by those of ordinary skill in the art. Photoresist is applied to the surface of 406, exposed to light through a mask of the desired geometry and developed. The doped amorphous carbon (low dielectric constant) layer is etched in alignment with the patterned photoresist (mask) in an oxygen plasma. During etching in the oxygen plasma, the carbon turns into carbon dioxide and leaves the surface as a vapor. A non-limiting example of process conditions for the etching is a temperature of 300 to 500 degrees centigrade, at a pressure of between 5 and 50 millitorr for a time of 1 to 20 minutes. Process gasses can be oxygen or fluorine. Argon can be used as a dilutant. FIG. 5A illustrates a pattern in the doped amorphous carbon (low dielectric constant) layer. Etched regions 502, 504, 506, 508, 510, and 512 exist after the etching previously described. Doped amorphous carbon (low dielectric constant) regions 244 result from the doped amorphous carbon 402 layer shown in FIG. 4.

Figure 5B:
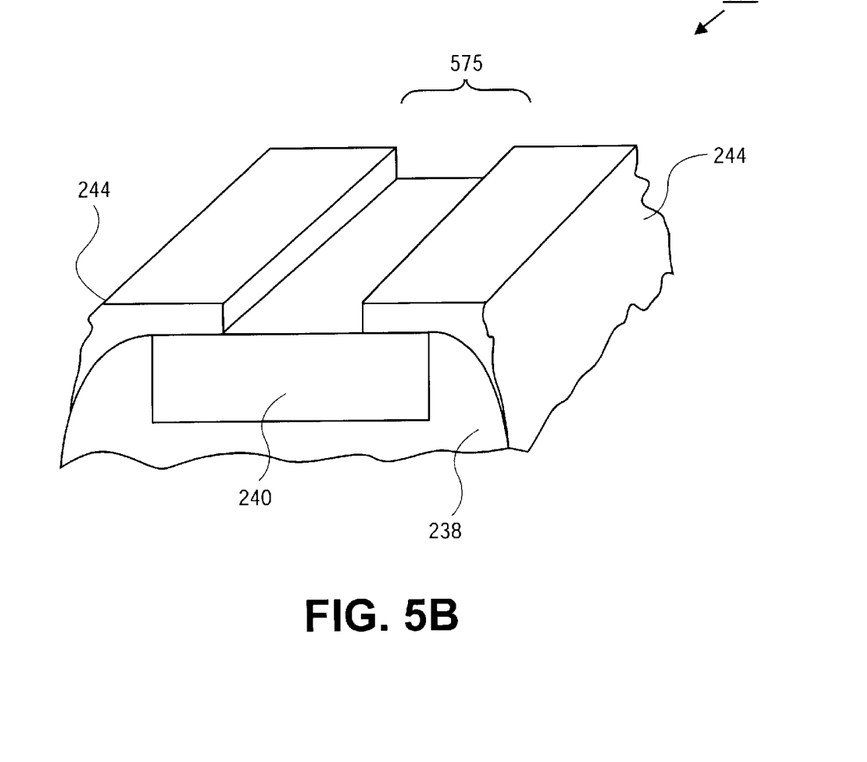
FIG. 5B is a close-up three-dimensional view of a trench in the doped amorphous carbon (low dielectric constant) layer.

FIG. 5B is a close-up three-dimensional view 550 of a trench etched into the doped amorphous carbon (low dielectric constant) layer. In various embodiments of the invention, trench widths of 0.1 to 0.5 microns are typical and trench depths of 0.2 to 0.8 microns are also typical.

Figure 5C:
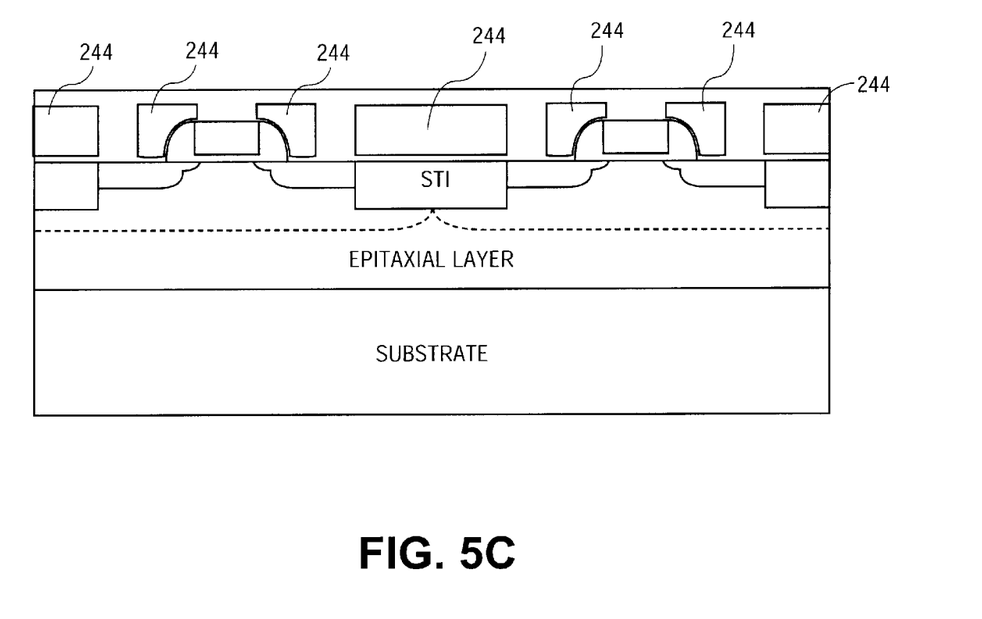
FIG. 5C shows a film of silicon dioxide deposited over the surface of the doped amorphous carbon (low dielectric constant) layer.

Following the formation of the pattern described in conjunction with FIG. 5A, for the carbon nanotubes, several successive applications of photolithography and etching are performed and described with the aid of the figures that follow, before the carbon based precursor material is transformed into carbon nanotubes. Those of ordinary skill in the art will recognize variations from the description given herein, however those variations and departures from this description do not place limitations on the invention. Accordingly, in one embodiment of the invention shown in FIG. 5C, a silicon dioxide film 580 is deposited over the surface of the structure shown in FIG. 5A or FIG. 5B resulting in FIG. 5C. The silicon dioxide film coats the doped amorphous carbon (low dielectric constant) sections 244 and the etched regions 502, 504, 506, 508, 510, and 512 (trenches) shown in FIG. 5A. During the discussion that follows, "surface" will include the regions 244 and the etched regions 502, 504, 506, 508, 510, and 512 (trenches) shown in FIG. 5A. Photoresist is applied to the "surface" and is exposed through a mask to harden the photoresist everywhere except over the trenches. The photoresist is removed from the trenches using an organic solvent, as is well known by those of ordinary skill in the art. The silicon dioxide film 580 is removed from the trenches using a wet chemical etch such as hydrofluoric acid or a suitable plasma. The photoresist is then removed from the doped amorphous carbon (low dielectric constant) regions 244. What remains after the procedure just described is a layer of silicon dioxide 610 left on regions 244 as shown in FIG. 6A.

The ohmic contacts 218, 220, 228, 232, 236, and 242 (FIG. 6A) are deposited using CVD or PVD techniques. The ohmic contact can be a film of metal such as titanium or tungsten. Following deposition of the film of metal, another photolithography and etching cycle removes the metal from all but the regions shown in FIG. 6A, e.g., 218, 220, 228, 232, 236, and 242. Etching with a plasma of $CF_4$ or $C_2F_6$ or a wet chemical hydrochloric acid etch removes the metal not protected by hardened photoresist. Following the metal etch process; the hardened photoresist is removed from the metal leaving ohmic contacts in the trenches over the desired regions. The "surface," as shown in FIG. 6A, is now ready for the deposition of the carbon based precursor material that will be used to form the carbon nanotubes.

Figure 6A:
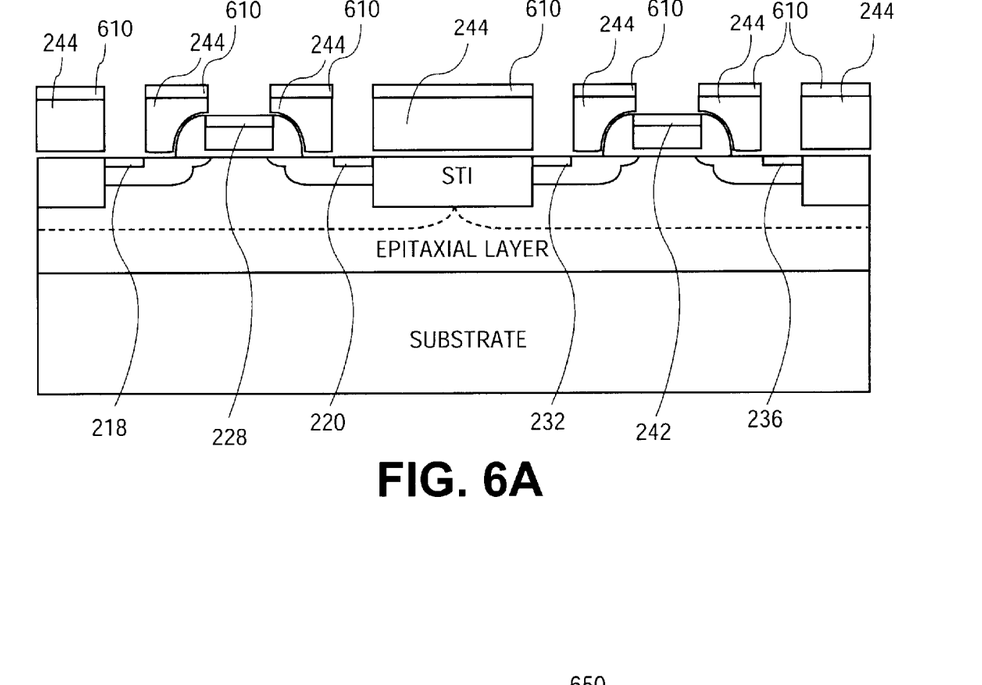
FIG. 6A illustrates the result of etching the silicon dioxide from the trench areas.
Figure 6B:
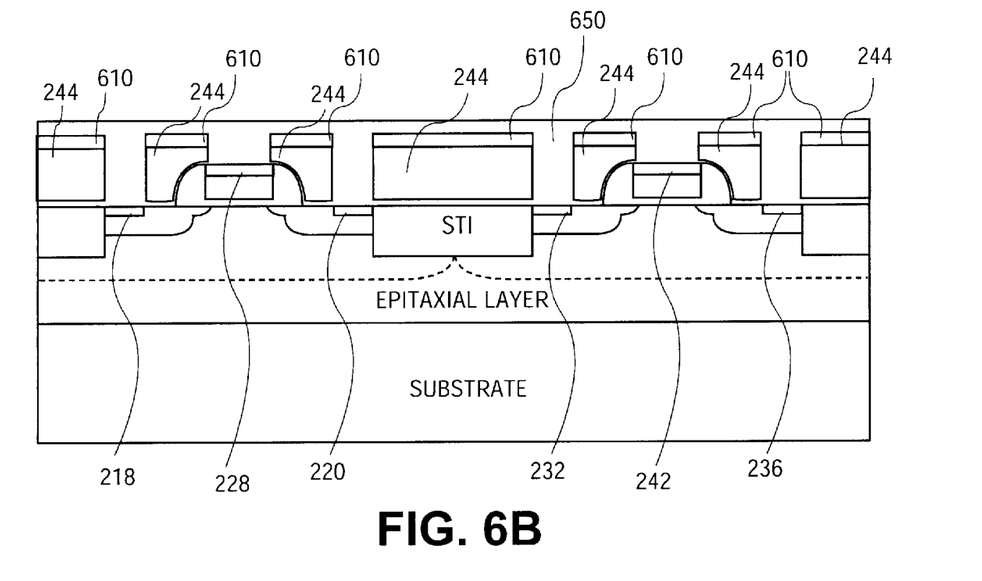
FIG. 6B illustrates a film of carbon based precursor material deposited over the surface of the integrated circuit structure.
Figure 7A:
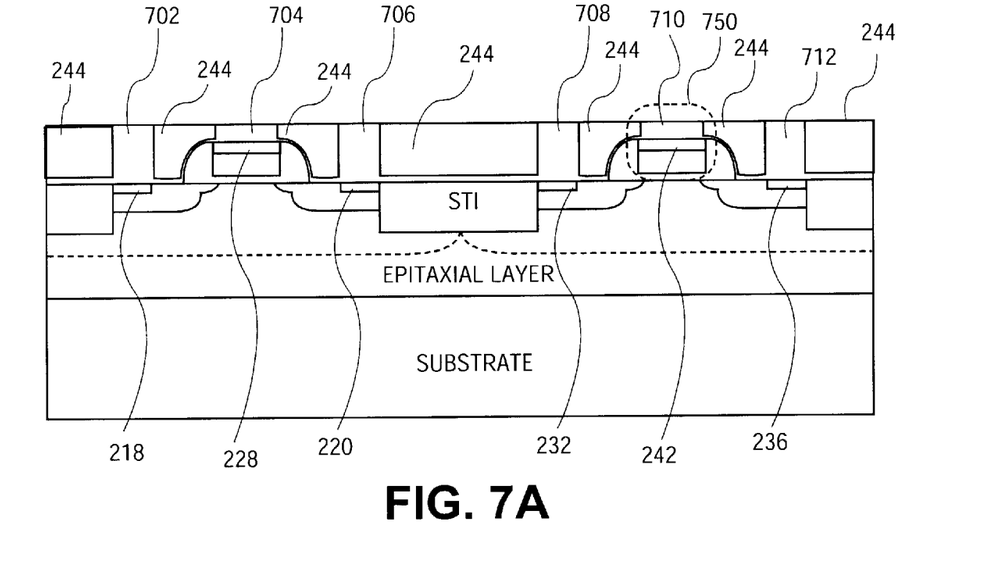
FIG. 7A illustrates carbon based precursor material deposited in a pattern of the doped amorphous carbon (low dielectric constant) layer following a "lift-off" process.

FIG. 6B illustrates carbon based precursor material 650 deposited onto the "surface" as shown in FIG. 6A. The carbon based precursor material is deposited as a film of amorphous or crystalline carbon or silicon carbide. The carbon based precursor material can be deposited in a number of different ways using PVD, CVD, or PECVD techniques. Following the deposition of the carbon based precursor material, exposure to hydrofluoric acid dissolves the silicon dioxide 610 remaining over the doped amorphous carbon (low dielectric constant) regions 244 allowing the carbon based precursor material 650 to "lift off" the "surface" leaving carbon based precursor material only in the trenches as shown in FIG. 7A at 702, 704, 706, 708, 710, and 712.

Figure 7B:
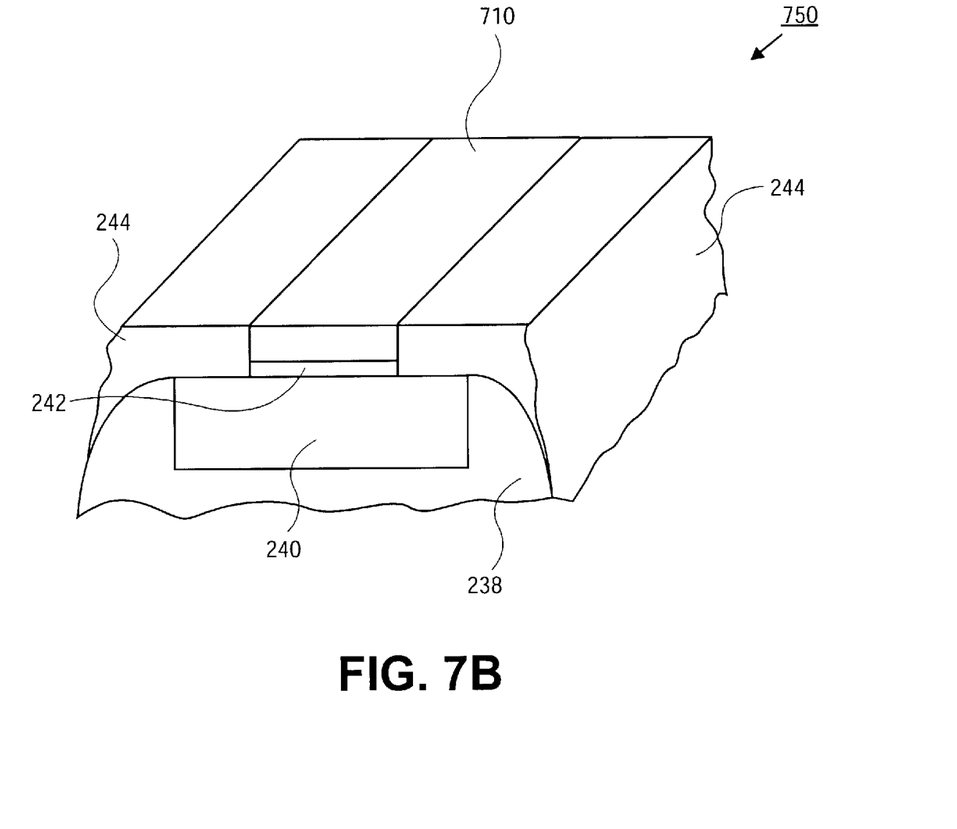
FIG. 7B is a close-up three-dimensional view of carbon based precursor material filing a trench in the doped amorphous carbon (low dielectric constant) layer.

FIG. 7B is a close-up three-dimensional view, in 750, of carbon based precursor material 710 filing a trench in the doped amorphous carbon (low dielectric constant) regions 244. Carbon based precursor film thicknesses can range from less than the trench depth to approximately twenty five percent greater than the trench depth. For trench depths of 0.2 to 0.8 microns the corresponding carbon based precursor film thickness can range from 0.1 to 1.0 micron.

Figure 7C:
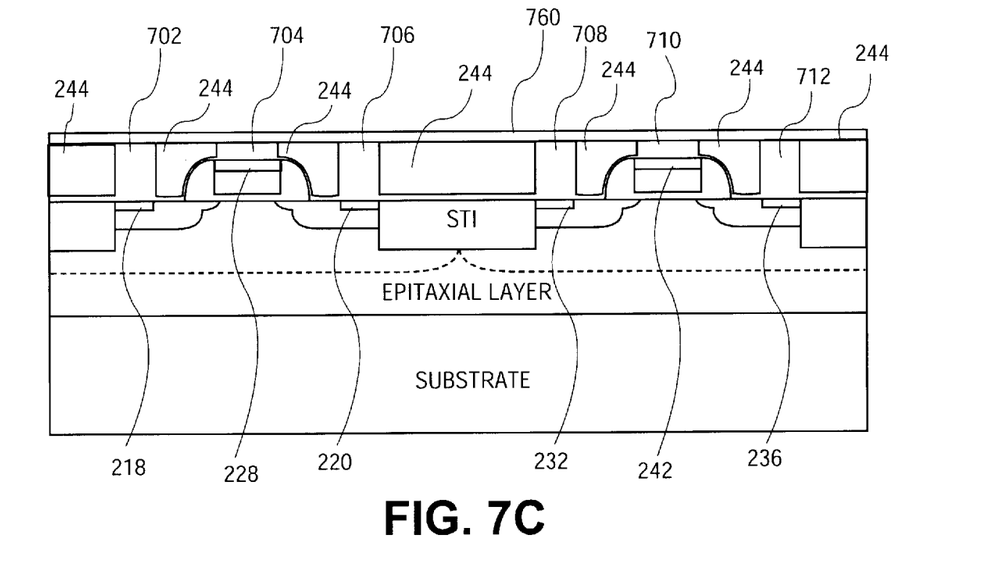
FIG. 7C illustrates covering the carbon based precursor material and the doped amorphous carbon (low dielectric constant) regions with a protective layer.

FIG. 7C illustrates covering the carbon based precursor material and the doped amorphous carbon (low dielectric constant) regions with a protective layer. Before the carbon precursor material, 702, 704, 706, 708, 710, and 712 is turned into carbon nanotubes, the doped amorphous carbon (low dielectric constant) regions 244 are covered with a protective layer to prevent the regions 244 from turning into nanotubes as well. A layer of silicon nitride or silicon dioxide indicated at 760 in FIG. 7C is deposited using CVD techniques as a protective layer. In one embodiment, photoresist is applied and hardened everywhere except over the carbon precursor material 702, 704, 706, 708, 710, and 712. The silicon nitride can be removed from the carbon precursor material using a plasma of a fluorocarbon such as $CF_4$ or $C_2F_6$. Silicon dioxide can be removed from the carbon precursor material with the same plasma etch or a wet chemical etch can be used. The resulting layer of silicon nitride or silicon dioxide, indicated at 770 in FIG. 8, protects the doped amorphous carbon (low dielectric constant) regions 244 from turning into nanotubes.

Carbon precursor material 702, 704, 706, 708, 710, and 712 (FIG. 8) is transformed into carbon nanotubes 246a, 246b, 246c, 246d, 246e, and 246f (shown in FIG. 2, FIG. 9A, and FIG. 10) by generating a plasma inside a chamber using microwave energy, RF energy, or other suitable means. The process gas for the plasma would be hydrogen, oxygen, or fluorine. Argon can be used as a dilutant. The process temperature can range from 300 to 500 degrees centigrade, at a pressure of 5 to 50 millitorr for a time of 1 to 20 minutes. In one embodiment of the invention, when amorphous or crystalline silicon carbide is used as the carbon based precursor material and exposed to an oxygen plasma the silicon is removed and the remaining carbon is converted into carbon nanotubes that exhibit very high electrical conductivity along the length of the tube. When the carbon nanotube is forming at process temperatures, during exposure to the plasma, a local monolayer of tungsten carbide can form between the carbon nanotube and the ohmic contact (when tungsten is used for the ohmic contact). The tungsten carbide layer, formed between the carbon nanotube and the tungsten ohmic contact, provides bonding and securely fixes the carbon nanotube to the ohmic contact.

Figure 8:
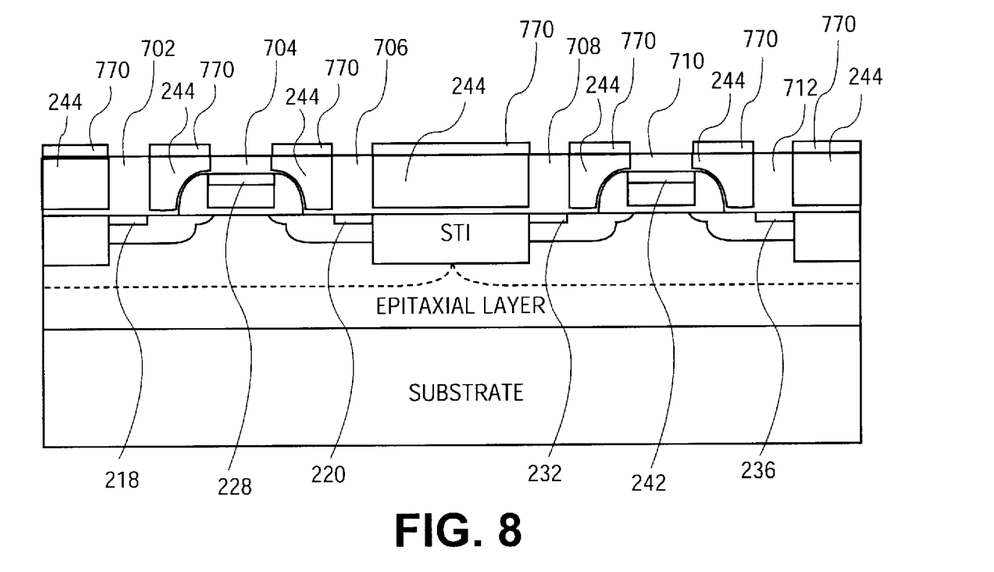
FIG. 8 illustrates the result of etching the protective layer away from the carbon based precursor material.

Following the conversion of the carbon based precursor material into carbon nanotubes the silicon nitride or silicon dioxide layer, 770 in FIG. 8, is removed from the amorphous carbon (low dielectric constant) regions 244 (FIG. 2). The silicon nitride can be removed from the amorphous carbon (low dielectric constant) regions 244 (FIG. 2) using a plasma of a fluorocarbon such as $CF_4$ or $C_2F_6$, silicon dioxide can be removed with the same fluorocarbon based plasma etch or a wet chemical etch can be used instead. Following removal of the silicon dioxide or silicon nitride, 770 in FIG.

Figure 9A:
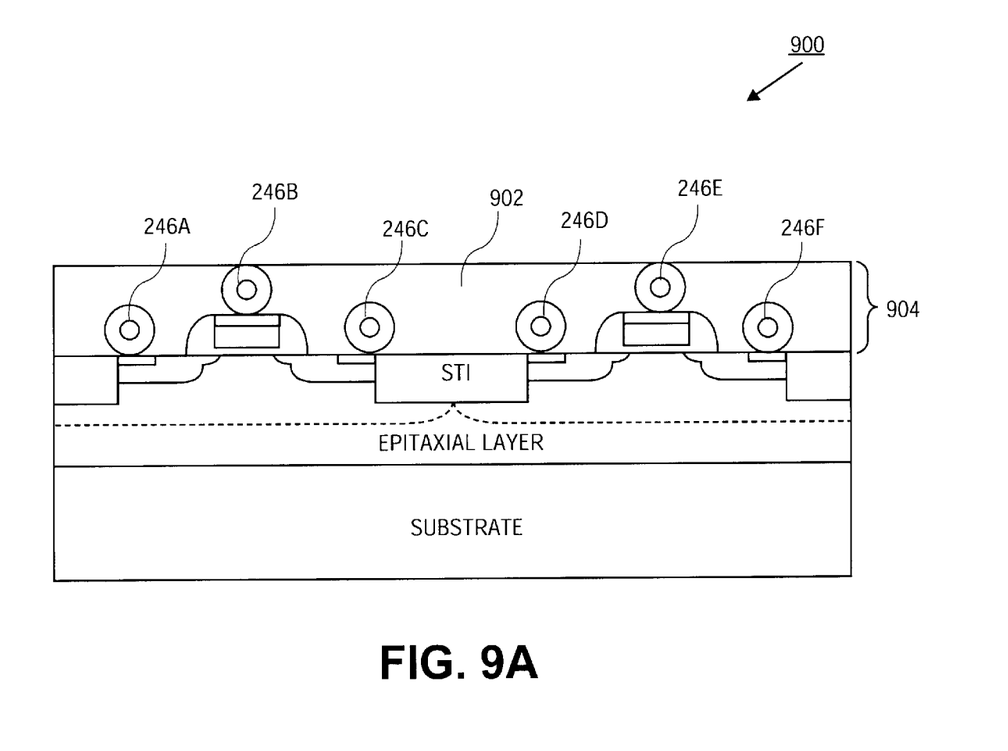
FIG. 9A illustrates a second layer of doped amorphous carbon applied over carbon nanotubes.

8, a second layer of doped amorphous carbon low dielectric constant material is applied, as shown in FIG. 9A.

FIG. 9A illustrates, at 900, a second layer of doped amorphous carbon 902 applied over the carbon nanotubes previously formed. The thickness of the doped amorphous carbon layer is increased from thickness 404 (FIGS. 4, 5, and 7) to a thickness 904 indicated in FIG. 9A. The surface of the second layer of doped amorphous carbon is planarized with CMP techniques as previously discussed.

Figure 9B:
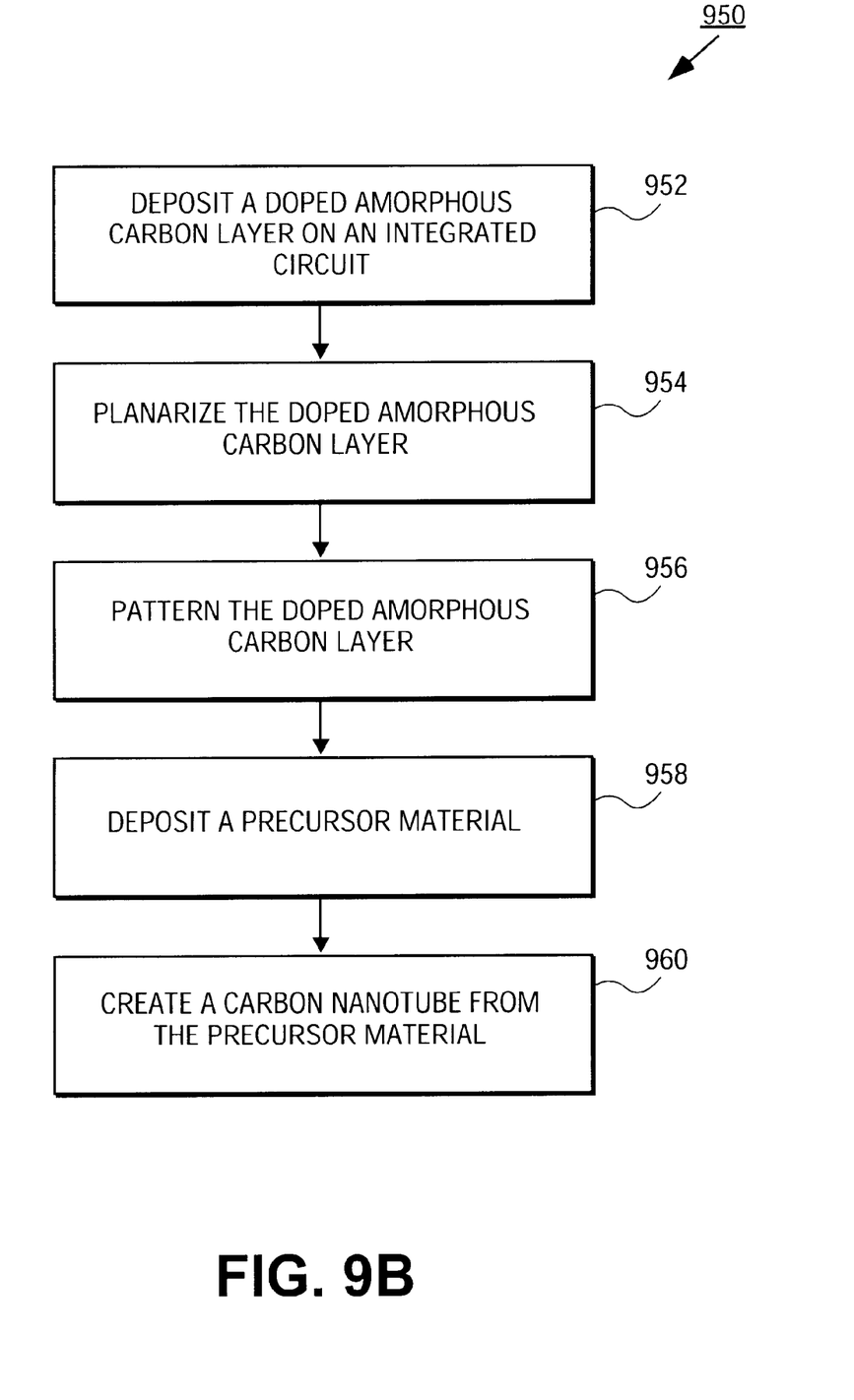
FIG. 9B illustrates a method for creating carbon insulation and a carbon nanotube.
Figure 10:
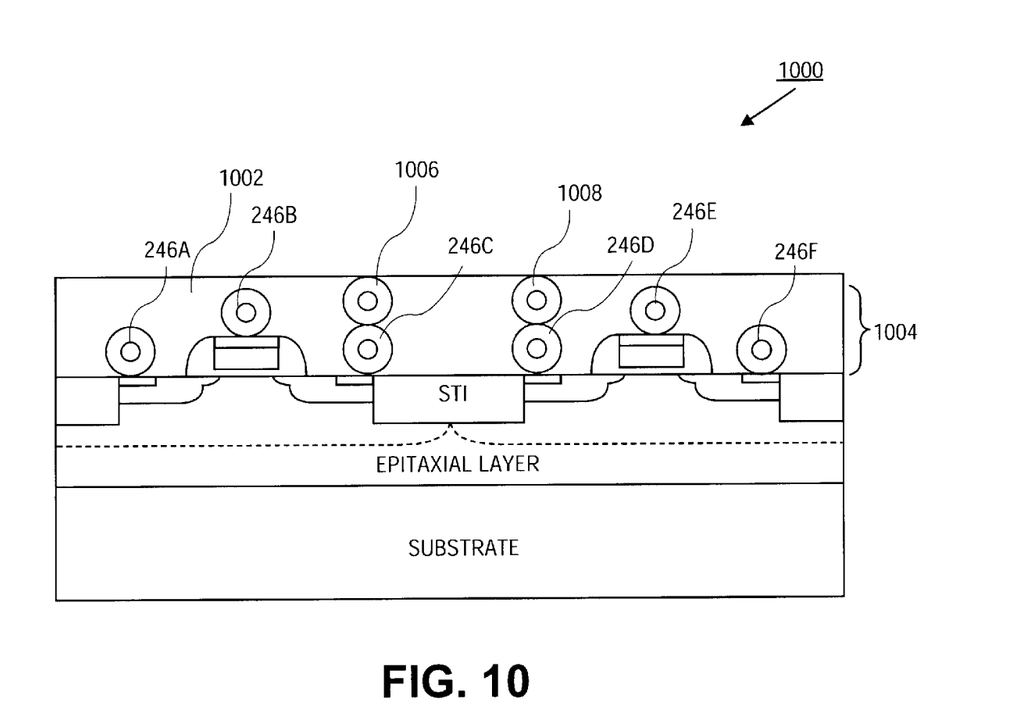
FIG. 10 illustrates a second layer of carbon nanotubes embedded in doped amorphous carbon (low dielectric constant) regions.

Multi layer interconnect structures can be obtained by repeating the process shown in FIG. 9B at 950 and previously described in FIG. 1 through FIG. 9A to create another interconnect layer containing doped amorphous carbon (low dielectric constant) regions and high conductivity carbon nanotube wires. With reference to FIG. 9B, another layer of doped amorphous carbon based (low dielectric constant) material is deposited onto the integrated circuit structure as indicated by process 952. The doped amorphous carbon material is planarized using chemical mechanical polishing (CMP), as is well known by those of ordinary skill in the art, at process 954. The planarized doped amorphous carbon (low dielectric constant) material is patterned using photolithography and etching at process 956 to create a second patterned layer. Carbon based precursor material is deposited into the pattern of the second patterned layer of doped amorphous based (low dielectric constant) material at process 958. Another layer of carbon nanotube(s) is created from the carbon based precursor material at process 960. FIG. 10 illustrates, at 1000, a second interconnect layer of carbon nanotubes embedded in doped amorphous carbon (low dielectric constant) regions. Referring to FIG. 10, following the processes previously described in conjunction with FIG. 9B, an additional layer of doped amorphous carbon (low dielectric constant) has been added to increase the thickness of the interconnect region to a thickness 1004. Additional trenches are etched and carbon nanotubes 1006 and 1008 are created using the processes previously described. Carbon nanotubes 1006 and 1008 can form two wires of a second layer of interconnections used to connect devices of the integrated circuit structure.

Vias are used in the current interconnection technology using silicon dioxide and copper traces to provide a path of electrical continuity from a first layer of interconnections to a second layer of interconnections. The function of the via is obtained in the case of the carbon nanotube 246c and the carbon nanotube 1006. Carbon nanotube 246c exists in the first layer of interconnections, which includes, 246a, 246b, 246c, 246d, 246e, and 246f. The second layer of interconnections is defined by carbon nanotube 1006 and 1008. Carbon nanotube 246c and carbon nanotube 1006 are in electrical continuity with each other, thus performing the function of a via e.g., providing a path of electrical continuity between hook up layers. Likewise, carbon nanotube 246d and carbon nanotube 1008 are in electrical continuity and perform the function of the via as well.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting. Accordingly, all such variations and modifications are included within the intended scope of the invention as defined by the following claims.

What is claimed is:

1. A method comprising:
   depositing doped amorphous carbon on an integrated circuit structure;
   planarizing the doped amorphous carbon;
   patterning the doped amorphous carbon to form a trench;
   depositing carbon based precursor material in the trench, wherein the trench was formed by the patterning; and
   converting the carbon based precursor material into a carbon nanotube, wherein the carbon nanotube connects a first device with a second device.

2. The method of claim 1, wherein the depositing doped amorphous carbon is performed in a co-deposition process.

3. The method of claim 2, wherein the co-deposition process uses a first gas containing a hydrocarbon and a second gas containing a dopant.

4. The method of claim 3, wherein the first gas is selected from the group consisting of methane, and ethane.

5. The method of claim 3, wherein the second gas is selected from the group consisting of silane and germane.

6. The method of claim 1, wherein the planarizing is performed using chemical mechanical polishing.

7. The method of claim 1, further comprising:
   using photolithography for the patterning; and
   etching the doped amorphous carbon to form the trench.

8. The method of claim 6, wherein the etching is performed with a gas selected from the group consisting of oxygen, and argon.

9. The method of claim 1, wherein the depositing is performed using a technique selected from the group consisting of physical vapor deposition, chemical vapor deposition, and plasma enhanced chemical vapor deposition.

10. The method of claim 1, wherein the carbon based precursor material is selected from the group consisting of amorphous carbon, amorphous silicon carbide, and crystalline silicon carbide.

11. The method of claim 1, wherein the converting is performed by generating a plasma using a process gas selected from the group consisting of argon, hydrogen, oxygen, and fluorine.

12. The method of claim 1, wherein the plasma is generated with one selected from the group consisting of radio frequency energy, microwave energy, and a direct current arc.

13. The method of claim 1, wherein the carbon nanotube provides a highly conductive path between the first device and the second device.

* * * * *